(12) United States Patent
Selvidge et al.

(10) Patent No.: US 8,099,273 B2
(45) Date of Patent: Jan. 17, 2012

(54) COMPRESSION OF EMULATION TRACE DATA

(75) Inventors: Charley Selvidge, Wellesley, MA (US); Robert W. Davis, Issaquah, WA (US); Peer Schmitt, Paris (FR); Joshua D. Marantz, Brookline, MA (US)

(73) Assignee: Mentor Graphics Corporation, Wilsonville, OR (US)

( * ) Notice: Subject to any disclaimer, the term of this patent is extended or adjusted under 35 U.S.C. 154(b) by 574 days.

(21) Appl. No.: 10/454,818

(22) Filed: Jun. 5, 2003

(65) Prior Publication Data

US 2004/0249623 A1 Dec. 9, 2004

(51) Int. Cl.
- G06F 9/455 (2006.01)
- G06F 7/00 (2006.01)
- G06F 11/00 (2006.01)

(52) U.S. Cl. ............... 703/23; 708/203; 714/29
(58) Field of Classification Search ........... 708/203; 714/29; 703/26–28, 23
See application file for complete search history.

(56) References Cited

U.S. PATENT DOCUMENTS

| | | | | |
|---|---|---|---|---|
| 5,392,420 A * | 2/1995 | Balmer et al. | | 703/28 |
| 5,680,583 A * | 10/1997 | Kuijsten | | 703/23 |
| 5,850,565 A * | 12/1998 | Wightman | | 710/1 |
| 5,895,463 A * | 4/1999 | Dowling et al. | | 707/3 |
| 6,061,511 A | 5/2000 | Marantz et al. | | |
| 6,088,694 A * | 7/2000 | Burns et al. | | 707/8 |
| 6,091,425 A * | 7/2000 | Law | | 345/619 |
| 6,092,038 A * | 7/2000 | Kanevsky et al. | | 704/9 |
| 6,307,557 B1 * | 10/2001 | Deering | | 345/428 |
| 6,457,144 B1 * | 9/2002 | Eberhard | | 714/45 |
| 6,629,297 B2 | 9/2003 | Ganesan et al. | | |
| 6,813,732 B2 | 11/2004 | Kurooka et al. | | |
| 6,912,856 B2 | 7/2005 | Morgan et al. | | |
| 6,925,606 B2 * | 8/2005 | Shaw et al. | | 715/749 |
| 6,957,179 B2 | 10/2005 | Debling | | |
| 6,985,848 B2 * | 1/2006 | Swoboda et al. | | 703/26 |
| 7,043,418 B2 * | 5/2006 | Swoboda et al. | | 703/28 |
| 7,058,855 B2 * | 6/2006 | Rohfleisch et al. | | 714/28 |
| 7,069,544 B1 * | 6/2006 | Thekkath | | 717/128 |
| 7,206,734 B2 | 4/2007 | Swoboda et al. | | |
| 7,330,809 B2 | 2/2008 | Tabe | | |
| 2002/0052729 A1 * | 5/2002 | Kyung et al. | | 703/28 |

(Continued)

FOREIGN PATENT DOCUMENTS

WO WO 03038613 5/2003

OTHER PUBLICATIONS

Roth et al., Database Compression, Sep. 1993, Sigmod Record, vol. 22, No. 3, Pa 31-39.*

(Continued)

*Primary Examiner* — Paul Rodriguez
*Assistant Examiner* — Eun Kim

(57) ABSTRACT

A system and method for compressing trace data from an emulation system. Scan chains may receive trace data from configurable logic blocks inside one or more emulation chips, and the data received from the scan chains may be compressed. Where delta compression is used, the scan chains may also perform a delta detection function. Alternatively, delta detection may be performed using the outputs of the scan chains. In addition, event detectors may be implemented within or outside of the scan chains. Compression of the trace data may include receiving a plurality of data sets and performing compression along cross-sections of the combined data sets.

20 Claims, 8 Drawing Sheets

U.S. PATENT DOCUMENTS

| | | | |
|---|---|---|---|
| 2002/0055828 A1 | 5/2002 | Swoboda et al. | |
| 2002/0089436 A1* | 7/2002 | Yariv | 341/51 |
| 2002/0162055 A1* | 10/2002 | Kurooka et al. | 714/45 |
| 2002/0177990 A1 | 11/2002 | Sample | |
| 2004/0019827 A1* | 1/2004 | Rohfleisch et al. | 714/29 |
| 2004/0073838 A1* | 4/2004 | Tabe | 714/29 |
| 2004/0255595 A1* | 12/2004 | Morgan et al. | 60/773 |

OTHER PUBLICATIONS

Burns et al., Efficient Distributed Backup with Delta compression, 1997, IOPADS 97. pp. 26-35.*

Hankerson et al. Introduction to Information Theory and Data Compression, CRC Press LLC, 1998, pp. v-xi, 57-93,99-111.*

Microsoft Computer Dictionary Fifth Edition, 2002, p. 191.*

Microsoft Computer Dictionary, Fifth Edition., Microsoft Press, 2002, p. 191.*

Richard A. Uhlig, et al., "Trace-Driven Memory Simulation: A Survey", ACM Computing Surveys, vol. 29, No. 2, Jun. 1997, pp. 128-170.

A. Dain Samples, "Mache: No-Loss Trace Compaction", Performance Evaluation Review, vol. 17, No. 1, May 1989, pp. 89-97.

* cited by examiner

COMPRESSION OF EMULATION TRACE DATA

FIELD OF THE INVENTION

Aspects of the present invention are directed generally to methods and apparatuses for handling trace data from an emulation system, and more particularly to compression of such trace data to a more manageable size.

BACKGROUND

Emulation systems typically include one or more integrated circuit chips, each of which emulates a portion of a digital design. The integrated circuit chips may be field-programmable devices (FPDs) such as field-programmable gate arrays (FPGAs). Each FPD includes a set of reconfigurable logic blocks (RLBs) interconnected by a programmable routing resource matrix. The typical FPGA has up to a few tens of thousands of usable RLBs. Design state elements, such as logic gates, are mapped onto the RLBs such that the typical FPGA may emulate up to several hundred thousand design logic gates.

During emulation of a design in an FPD, it is desirable to obtain trace data of the states of the various design state elements and/or other design elements and/or design signals mapped onto the emulation FPD. Such trace data, also known as user visibility data, is made available to the user and is often used to debug a design. Unfortunately, as the number of state elements mapped into an FPD increases, the amount of trace data increases as well. For example, an FPGA emulating one hundred thousand state elements would generate up to one hundred thousand bits, or 0.1 Mb, of trace data per clock cycle. This trace data is further increased where emulation systems incorporate a number of parallel FPGAs. For instance, a system having ten parallel FPGAs would generate up to 1 Mb of trace data per clock cycle.

The amount of trace data to be dealt with is dramatically increased when one considers that emulation runs typically involve a plurality of clock cycles, such as hundreds of millions of clock cycles or more. For example, where an emulation is run over one billion clock cycles, the total amount of trace data generated during the emulation may be up to (1 billion)×1 Mb=1,000 terabits (Tb). Thus, there becomes the problem of how to store, transfer, and/or otherwise handle all of this trace data. Although the cost of memory has decreased over the years, it is nevertheless expensive. Large amounts of memory also takes up valuable real estate and requires additional power, both of which are usually of limited availability in an emulation system. It would therefore be desirable to limit the amount of memory in an emulation system.

Yet another complication arises when one considers the speed at which the emulation clock runs. Typical emulation systems may run a clock at 1 MHz or more. For example, where the clock in the above example is run at 1 MHz, the total bandwidth of trace data generated may be up to (1 Mb)×(1 MHz)=1 Tb per second. When an emulation system is run over multiple emulation clock cycles, the bandwidth of trace data often exceeds the capabilities of state-of-the-art physical interfaces, such as integrated circuit packaging pin limitations, memory chip size, and network bandwidth.

SUMMARY OF THE INVENTION

There is therefore a need for an emulation system that can provide useful quantities of trace data without requiring unreasonable trace data transfer bandwidth requirements and/or data storage requirements. Thus, according to one aspect of the present invention, some or all of the trace data from an emulation system may be compressed. Any suitable data compression algorithm may be used without departing from the scope of the invention. Such compression may occur prior to or after storage.

According to a further aspect of the present invention, scan chains may be implemented to receive trace data from configurable logic blocks inside one or more emulation chips, and the data received from the scan chains may be compressed. Where delta compression is used, the scan chains may also perform a delta detection function. Alternatively, delta detection may be performed using the outputs of the scan chains. In addition, one or more detectors may be implemented within or outside of the scan chains.

According to still another aspect of the present invention, compression of the trace data may include receiving a plurality of data sets and performing compression along cross-sections of the combined data sets.

These and other features of the invention will be apparent upon consideration of the following detailed description of illustrative embodiments.

BRIEF DESCRIPTION OF THE DRAWINGS

The foregoing summary of the invention, as well as the following detailed description of illustrative embodiments, is better understood when read in conjunction with the accompanying drawings, which are included by way of example, and not by way of limitation with regard to the claimed invention.

DETAILED DESCRIPTION OF ILLUSTRATIVE EMBODIMENTS

An Illustrative Emulation Environment

Figure 1:
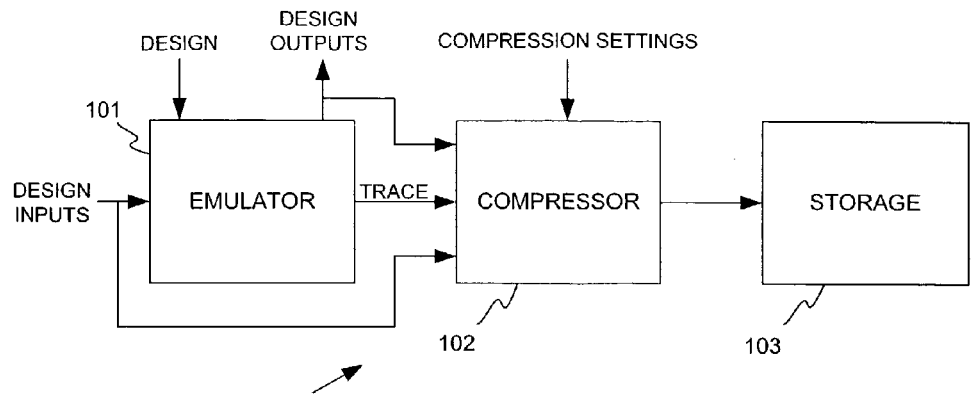
FIGS. 1 and 3 are functional block diagrams of illustrative embodiments of an emulation and trace storage system that produces compressed trace data in accordance with at least one aspect of the present invention.
Figure 2:
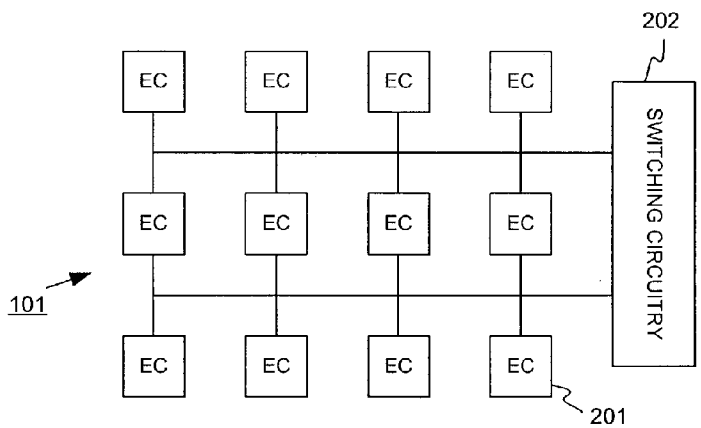
FIG. 2 is a functional block diagram of an illustrative embodiment of an emulator in accordance with at least one aspect of the present invention.

Referring to FIG. 1, an illustrative embodiment of an emulation and trace storage system 100 may functionally include an emulator 101, a data compressor 102, and/or storage 103. The term "emulator" is used broadly herein and includes not only systems that perform pure hardware emulation, but also those that perform a combination of hardware emulation and software simulation, as well as hardware acceleration and/or co-simulation. As shown in FIG. 2, the emulator 101 may include one or more integrated circuit chips 201 having reconfigurable logic (called herein "emulation chips," or "ECs"), such as an FPD, that are reconfigurable to embody a design to be emulated. The FPD may include an FPGA or other similar reconfigurable logic device. The emulator 101 may also include other integrated circuit chips and/or other circuitry. The emulation chips 201 may be application-specific integrated circuits (ASICs). Each of the emulation chips 201 may be selectively interconnected via switching circuitry 202. The switching circuitry 202 may be part of one or more of the emulation chips 201 and/or physically separate from but connected to the emulation chips 201. The switching circuitry 202 may include any one or more switches, routers, and/or the like, such as crossbar(s), partial crossbars(s), and multiplexors. Generally, each of the emulation chips 201 may be made up of numerous reconfigurable logic blocks (RLBs) that may each be reconfigurable to emulate a particular low-level or high-level logic function. Together, the emulation chips 201 and the switching circuitry 202 may embody and emulate a particular logic design. Where the design is sufficiently large, which is typically the case, the design may be partitioned amongst the various emulation chips 201. Any number of emulation chips 201 and switching circuits 202 may be used in combination to emulate a particular logic design.

When a design is embodied in the emulator 101, the emulator 101 may emulate the design based on design inputs that stimulate the design. The design inputs may include a plurality of parallel inputs over a plurality of clock cycles. The set of design inputs for each clock cycle is sometimes referred to as the design input set. A set of data may include one or more bits of data, arranged as a vector or other arrangement. The design input set may be input to one or more of the emulation chips 201. During emulation, and in response to the design input set, the emulator 101 may generate a large number of continuously varying internal states, as well as a plurality of design outputs, also known as a design output set. The internal states may represent the states of nodes within the design. For example, internal states may include the states of one or more of the RLBs, as well as the states of the inputs and outputs of the individual emulation chips 201. Although the inputs and outputs of the emulation chips 201 are not internal to the chips, they are considered states that are internal to the design being emulated. Thus, the emulation chip 201 inputs and outputs are internal states for purposes of this specification. These internal states may be extracted and outputted by the emulator 101 and/or by one or more of its emulation chips 201. The extraction of such internal state data, also called herein "trace data," may be performed by trace circuitry, such as by using one or more scan chains disposed within each emulation chip 201.

Referring back to FIG. 1, the data compressor 102 may compress some or all of the trace data, the design inputs, and/or the design outputs. Any form of data compression may be used. However, it has been found that delta compression works particularly well for trace data. The reason for this is that, in general, it can be expected that a large number of internal states do not change from one clock cycle to the next clock cycle. The same may be said for the design inputs and design outputs, and it is especially true for portions of the design that are inactive at times. For instance, where the design is logic for a cellular telephone, a large portion of the design (excluding the clock) will likely be inactive while a telephone call is not being made. Although not all designs necessarily have such a characteristic, it has been found that many do. The present invention, however, can be used with any design regardless of how often the internal states, design inputs, or design outputs change.

The trace data compressor 102 may be physically part of the emulator 101 or it may be physically separate. For example, the trace data compressor 102 may be integrated within one or more of the emulation chips 201 in the emulator 101, as will be further discussed below.

Figure 3:
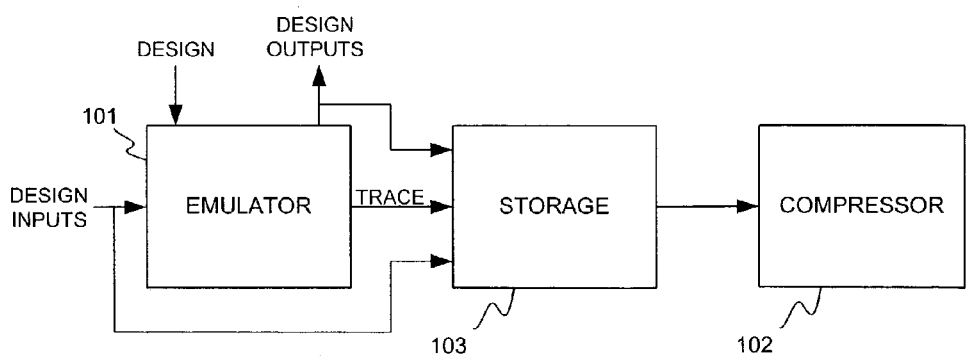

Some or all of the compression may be performed in real time while the emulator 101 is actually emulating the design. Thus, while the emulator 101 is emulating, some or all of the trace data, design inputs, and/or design outputs may be stored in compressed form in storage 103. This reduces the amount of storage 103 necessary. However, compression need not take place in real time, especially where the size of storage 103 is not of great concern. For instance, it may be desirable to store the data in uncompressed or partially compressed form and then forward the stored data at a later time to the data compressor 102 for compressed transmission elsewhere. FIG. 3 functionally shows an alternative configuration in which the trace data, the design inputs, and/or the design outputs are sent to storage 103 prior to being compressed by the compressor 102. In some embodiments, the configurations of FIGS. 2 and 3 may be combined such that the emulator 101 may be directly coupled to both the compressor 102 and the storage 103.

Figure 14:
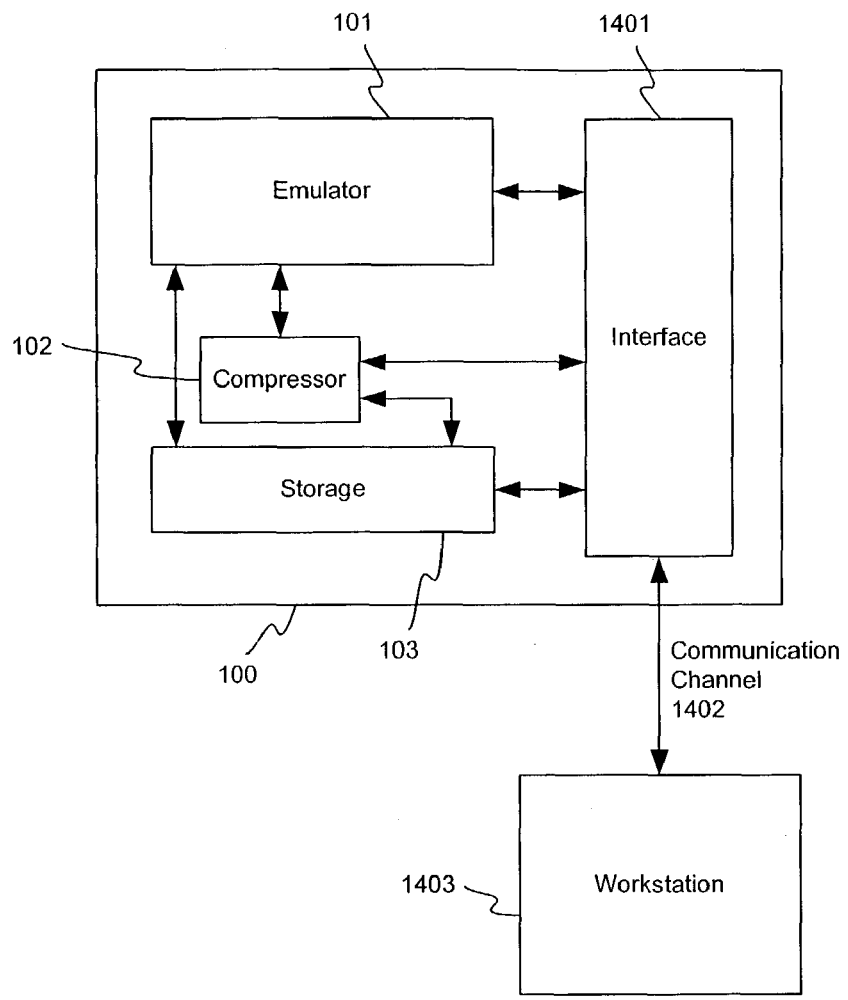
FIG. 14 is a high-level functional block diagram of an illustrative embodiment of an emulation system and workstation in accordance with at least one aspect of the present invention.

Referring to FIG. 14, the emulation system 100 may further include at least one communications interface 1401 that communicates with at least one workstation 1403 via at least one communication channel 1402. The workstation 1403 may run application software that generates configuration code based on a user's design. The configuration code may be sent over the communication channel 1402 to the interface 1401 and then on to the emulator 101. The emulator 101 may reconfigure itself, in accordance with the configuration code, to embody the design. When the emulator 101 is run, thereby emulating the design, the raw and/or compressed trace data may be forwarded to the storage 103. The box designated element 100 may be considered a functional dividing line, or it may be a physical housing containing some or all of the elements 101, 102, 103, 1401 therein. Where the element 100 is a physical housing, the communication channel 1402 may be embodied as an electrical conductor such as a cable that runs out of the housing and connects to the workstation 1403 that is physically separate from the housing.

The raw and/or compressed trace data may further be forwarded to the interface 1401 and on to the workstation 1403 via the communication channel 1402. Some or all of the elements of the emulation system 100 may be disposed on one or more circuit boards that may intercommunicate with one another. Thus, compression of the trace data may occur outside of the workstation 1403, either online while the emulation is running or offline after the emulation has run. For example, the emulation system 100 may contain one or more circuit boards, each circuit board including at least one emulation chip 201 and at least one compressor 102 coupled to the emulation chip(s) 201. In such an embodiment, the compressor 102 may be an integrated circuit chip on the circuit board but a separate chip from the emulation chip 201. In another embodiment, the emulation chip(s) 201 on the circuit board(s) may each include a compressor 102 within each emulation chip 201. In other words, the emulator 101 and the compressor 102 may both be in the same integrated circuit chip. In such an embodiment, the emulation chips 201 may be ASICs. Also, the storage 103 may be within the emulation system 100 (e.g., on the same circuit board as the emulation chips and compressors 102) or outside of and physically part of the emulation system 100. Alternatively, compression of the trace data may occur inside the workstation 1403, either online while the emulation is running or offline after the emulation has run.

Figure 4:
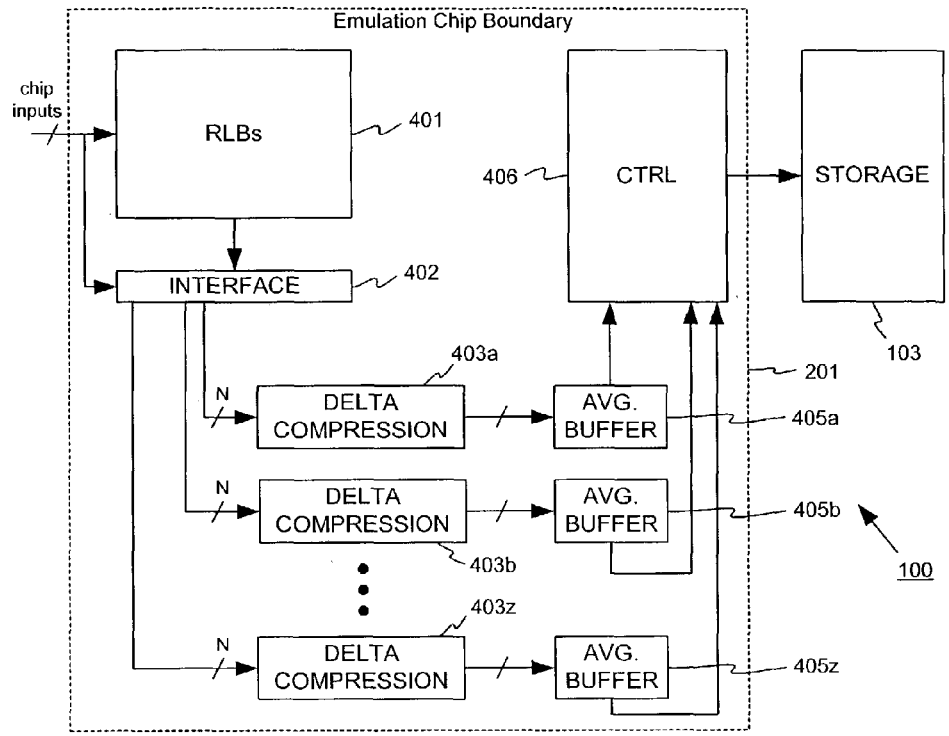
FIG. 4 is a functional block diagram of the emulation system of FIGS. 1 and 2, showing additional detail within an emulation chip.

Referring to FIG. 4, a more detailed illustration of the illustrative emulation system 100 is shown. Each emulation chip 201 may include one or more sets of RLBs 401 as discussed previously. The set of RLBs 401 may include a plurality of scan chains for obtaining the internal states of the RLBs 401. Each scan chain may be of a length so as to be configurable to obtain the internal states of up to at least M RLBs, where M may be one or may be greater than one.

The outputs of the scan chains and/or the inputs to the emulation chip 201, may be coupled to an interface 402 that assembles and/or encodes data extracted from the scan chains and/or chip inputs into a form that may be needed in preparation for compression. For example, the scan chains and/or chip inputs may together directly or indirectly provide the interface 402 with N input data sets each M bits in length, where N may be one or may be greater than one. In another example, only the inputs to the emulation chip 201 are prepared for compression. In some embodiments, there may be N scan chains, each providing a different one of the N input data sets. The interface 402 may reassemble the input data sets in order to provide output data sets that are each a different cross-section of the input data sets. In other words, as will be described more fully below, the trace data output for compression may be arranged as M sets each N bits in length.

The interface 402 may further encode the data received from the scan chains and/or emulation chip inputs. Where delta compression is used, such encoding may include detecting changes, or deltas, in the trace data from one clock cycle to the next clock cycle and outputting data indicating the positions of those deltas. For example, the encoded trace data may include bits set to one corresponding to each bit location that the received trace data changes.

The interface 402 may be part of and embodied by the RLBs 401 or it may be a separate circuit. The interface 402 may provide output data sets to one or more compressors, such as delta compressors 403a-403z. Each of the delta compressors 403a-403z may receive N bits of trace data per design clock cycle, may compress the data, and may output compressed data. In some embodiments, the integrated circuit chip 201 may be logically divided into one or more portions, such as halves or quadrants. Each portion may generate a subset of the N bits of trace data per clock cycle. For example, where the integrated circuit chip 201 is logically divided into quadrants, then each quadrant may generate N/4 bits of trace data per clock cycle. Each quadrant or other portion may share the same delta compressors. For instance, the N/4 bits of data from each quadrant may be multiplexed into the same one or more delta compressors 403a-403z.

The compressed data may be received by a time-averaging buffer 405, which may include a first-in-first-out (FIFO) buffer and/or a random access memory (RAM). It may be reasonably expected that the outputs of the delta compressors 403a-403z will be of variable bandwidth. This is because the amount of compression attained generally depends upon the content of the data to be compressed. Accordingly, the time-averaging buffer 405 may be configured such that even though the inputs to the time-averaging buffer 405 are of varying bandwidth, the time-averaging buffer 405 nevertheless outputs data at a constant bandwidth or no more than a maximum bandwidth. The data from the time-averaging buffer 405 may then be read into a storage controller 405 such as a double data rate (DDR) controller. In the event that the buffer 405 overflows, compression may be bypassed and a snapshot of the original trace data may be stored instead for one or more clock cycles or until the buffer 405 recovers. In either event the compressed data output from the buffer 405 (or uncompressed trace data from the interface 402) may be forwarded through one or more pins of the emulation chip 201 and to the storage controller 406, and then forwarded on to storage 103.

Figure 11:
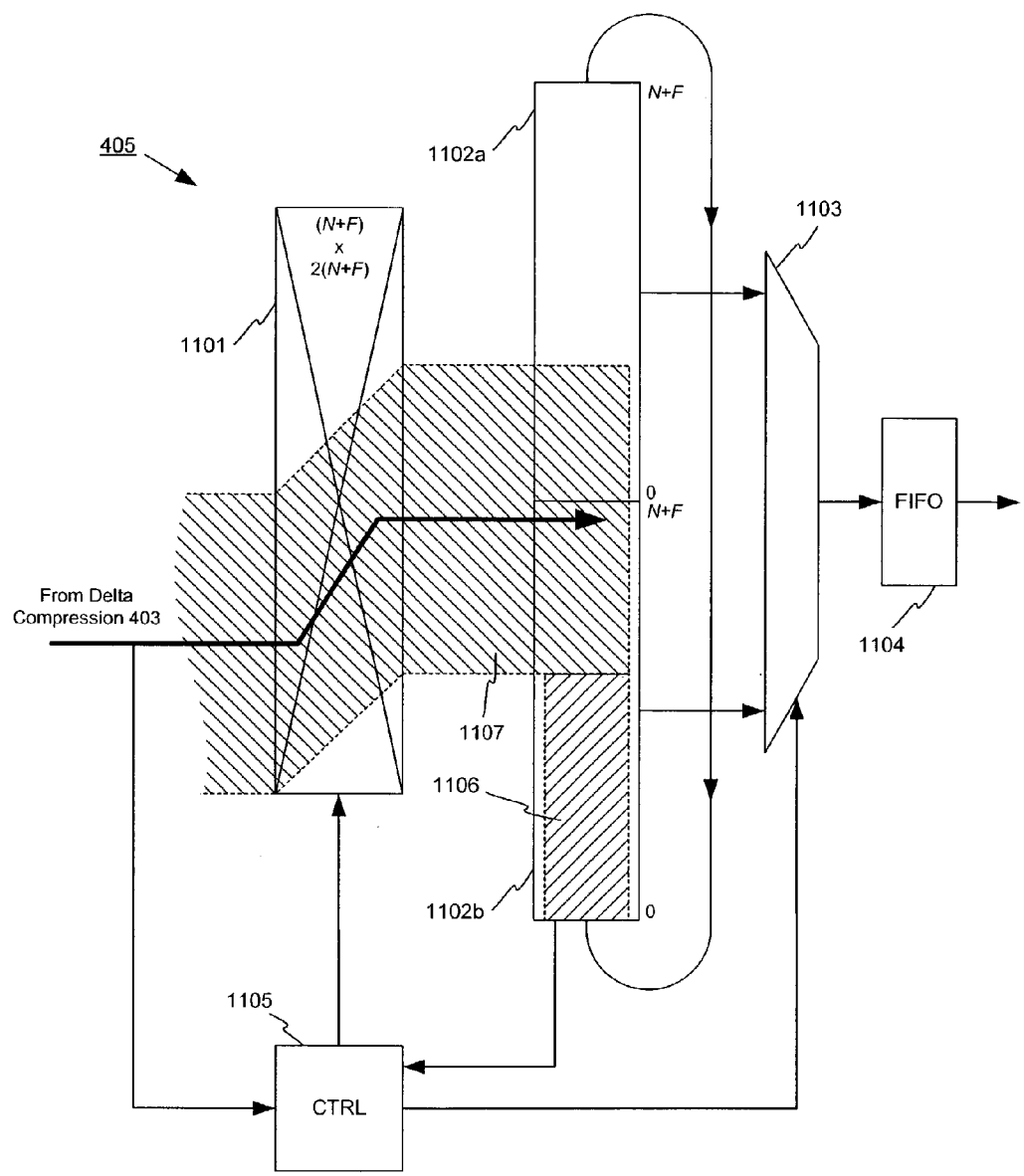
FIG. 11 is a functional block diagram of an illustrative embodiment of a time-averaging buffer in accordance with at least one aspect of the present invention.

An illustrative embodiment of one of the time-averaging buffers 405 (e.g., time-averaging buffer 405a) is shown in FIG. 11. The time-averaging buffer 405 may include switching circuitry such as a crossbar 1101 may receive some or all of the outputs from the delta detector(s) (e.g., delta detector 403a). The crossbar 1101 may be an (N+F) by 2(N+F) crossbar, where F is the length of any overhead bits, such as the flag that is discussed later. However, other sizes of switching circuitry may be used. The time-averaging buffer may further include two buffers 1102a, 1102b that are each at least N+F bits in length. In alternative embodiments, the two buffers 1102a, 1102b may be combined as a single buffer 2(N+F) bits in length. The present discussion will be with regard to two buffers 1102a, 1102b. Where a single combined buffer is used, the present discussion of buffer 1102a will be applicable to a first half of the combined buffer, and the present discussion of buffer 1102b will be applicable to a second half of the combined buffer.

Each buffer 1102a, 1102b is a single bit in width in this embodiment, although other widths may be used as long as each buffer 1102a, 1102b stores at least (N+F) bits total. Each buffer 1102a, 1102b may further have a plurality of at least (N+F) inputs, for a total of at least 2(N+F) input, each coupled to a corresponding different output of the crossbar 1101. Thus, for example, there may be at least 2(N+F) parallel connections between the crossbar 1101 and the buffers 1102a, 1102b.

The time averaging buffer 405 may further include a multiplexor 1103 or other switching circuit, a buffer 1104 such as a first-in-first-out (FIFO) buffer, and a controller 1105. The time averaging buffer 405 may further include a controller 1105 for controlling the operation and/or configuration of the crossbar 1101, the buffers 1102a, 1102b, the multiplexor 1103, and/or the buffer 1104.

In operation, compressed data 1107 from the delta compressor 403 may be received by the crossbar 1101. The data 1107 may be of variable size from set to set. For example, a first set of the data 1107 may be 100 bits in length, and the next set of the data 1107 may be 237 bits in length. Accordingly, the data 1107 is of a variable bandwidth that can vary widely depending upon whether and how much the data 1107 is compressed. Where the size of a particular set of the data 1107 is large (it is expected that the incoming data 1107 would not exceed N+F bits in length), huge spikes in the incoming bandwidth will be experienced.

The controller 1105 may also receive the compressed data 1107 to determine the size of the compressed data 1107. The controller 1105 may dynamically configure the crossbar 1101 to direct the data 1107 to a certain range of outputs of the crossbar 1101 depending upon the size the of the data 1107. The range of outputs may additionally or alternatively depend upon how much data (or unread data) is already stored in the buffers 1102a and/or 1102b. The term "unread data" refers to data that has not yet been read from the buffers 1102a or 1102b to the multiplexor 1103 and/or buffer 1104. In general, the controller 1105 may configure the crossbar 1101 to write data to one or both of the buffers 1102a, 1102b at the point that the previously-stored unread data has ended, i.e., by stacking the new data 1107 above the existing data 1106. The controller 1105 may keep track of the last point written by the use of a pointer that is updated as new data is written into the buffers 1102a, 1102b.

Assume, for example, that the crossbar 1101 is a 258×516 crossbar (i.e., 258 inputs and 516 outputs), and that the buffers 1102a and 1102b are each 258×1 bits, each with addresses 0-257. There would thus be 258×2=516 total parallel connections between the crossbar 1101 and the buffers 1102a, 1102b. Assume further that the stored unread data 1106 is 150 bits in length, and that the incoming data 1107 is 200 bits in length. The stored unread data 1106 may thus be stored at, e.g., addresses 0-149 in buffer 1102b. The new incoming data 1107 may be controlled by controller 1105 and switched by crossbar 1101 to be written in parallel into the buffer 1102 beginning at the next address, which would be 150. Because the incoming data 1107 is a total of 200 bits and the remaining space left in the buffer 1102b is only 108 bits, the buffer 1102b will be full, with addresses 0-149 containing data 1106 and addresses 150-257 containing data 1107. The remainder of data 1107 may overflow into buffer 1102a, by being written in parallel into addresses 0-106 of buffer 1102a.

This process of stacking new incoming data 1107 onto stored unread data may be repeated. Responsive to one of the buffers 1102a, 1102b becoming full of unread data, the controller 1105 may cause that buffer to read out the entire data contents stored therein (e.g., stored in addresses 0 to N+F) in parallel to the multiplexor 1103. When the data has been read out of one of the buffers 1102a, 1102b, the data in that buffer may thereafter be considered data that has been read, as opposed to unread data. Alternatively, the data in that buffer may be erased. When buffer 1102a is full, any overflow is written starting at the bottom (i.e., address 0) of buffer 1102b. Thus, the buffers 1102a, 1102b effectively create a cyclic buffer that begins writing at the bottom of buffer 1102b, then up to the top (i.e., address N+F) of buffer 1102b, then up through the bottom of buffer 1102a, then up to the top of buffer 1102a, and then looping back around to the bottom of buffer 1102b.

The controller 1105 dynamically controls the multiplexor 1103 to receive either the data from buffer 1102a or the data from buffer 1102b, which is then forwarded to the buffer 1104. Because the data is read out of one or the other of buffers 1102a, 1102b only when that particular buffer 1102a, 1102b has become full of unread data, the bandwidth of the data read into the multiplexor 1103, and ultimately into the buffer 1104, is of a more stable bandwidth. In the illustrated example, it is expected that the data being read into the buffer 1104 will always be in N+F bit chunks. In general, the data being read into the buffer 1104 will be in chunks equal to the size of one of the buffers 1102a, 1102b. However, because the length of time it takes to fill one of the buffers 1102a, 1102b is a function of the bandwidth of the various sets of incoming data 1107, the delay between each reading of the buffers 1102a, 1102b is variable. Thus, while the bandwidth into the buffer 1104 is fixed while one of the buffers 1102a, 1102b is being read, the average bandwidth over time into the buffer 1104 is variable.

The storage controller 405 may read from the buffer 1104 at a bandwidth that is independent of the bandwidths of the incoming data 1107 and/or the data being read into the buffer 1104. Over a long period of time, the average bandwidth of data being read out of the buffer 1104 is equal to the average bandwidth of the incoming data 1107. However, the data stored in the buffer 1104 may be read out at a less variable bandwidth that peaks at a level lower than N+F bits per read cycle. In some embodiments, the data stored in the buffer 1104 may be read out at a predetermined constant bandwidth. In other embodiments, the data stored in the buffer 1104 may be read out at a bandwidth that does not exceed a predetermined maximum bandwidth, the maximum bandwidth being lower than the potential peak bandwidth of the incoming compressed data 1107. Where the trace data is compressed offline, bandwidth to an external memory is not as much of a concern, however this type of compression and buffering may provide savings in storage space and/or transmission time to the user.

It has been found that such a time-averaging buffer 405 generally does not overflow where delta compression is used and the depth of the buffer 1104 (i.e., the total storage capacity) is approximately three times the amount of trace data per clock cycle, or more. For instance, where there are 256 trace sets input to the delta compressors, each trace set being sixteen bits long, then the depth of the time-averaging buffer 405 may be approximately (3×16×256)=12,288 bits deep, or more. In the event that the time-averaging buffer 405 overflows, compression may be bypassed and a snapshot of the original trace data may be stored instead for one or more clock cycles or until the time-averaging buffer 405 recovers. In either event the compressed data output from the time-averaging buffer 405 (or uncompressed trace data from the interface 402) may be forwarded through one or more pins of the emulation chip 201 and to a storage controller 406 such as a double-data-rate (DDR) controller, and then forwarded on to storage 103.

Because N+F and 2(N+F) are not necessarily powers of two, it may be uneconomical to design the crossbar to be of a size of exactly (N+F)×2(N+F). For the same reason, it may also be uneconomical to design the buffers 1102a, 1102b to be of a size of exactly (N+F) bits. And for the same reason, it may be uneconomical to design the buffer 1104 to be exactly three times the amount of trace data per clock cycle. Accordingly, any or all of these devices may be designed to have a capacity of the next highest power of two. For example, where N+F=258, the buffers 1102a, 1102b may each be buffers of size 512×1, since 512 is the next power of two after 258. Another way to economize is to round any or all of these devices to the nearest multiple of eight. So, for instance, where N+F=258, the buffers 1102a, 1102b may each be buffers of size 264×1, since 264 is the next multiple of eight after 258. Where extra resources are provided as in this case for economy, the extra resources may either be ignored or filled with dummy bits.

Although FIG. 4 shows certain of the elements of the emulation system 100 being disposed within the emulation chip 201 itself, one or more of the elements may be disposed outside the emulation chip 201 without departing from the scope of the invention. Additionally, storage 103 may be located on or off the emulation chip 201.

Figure 5:
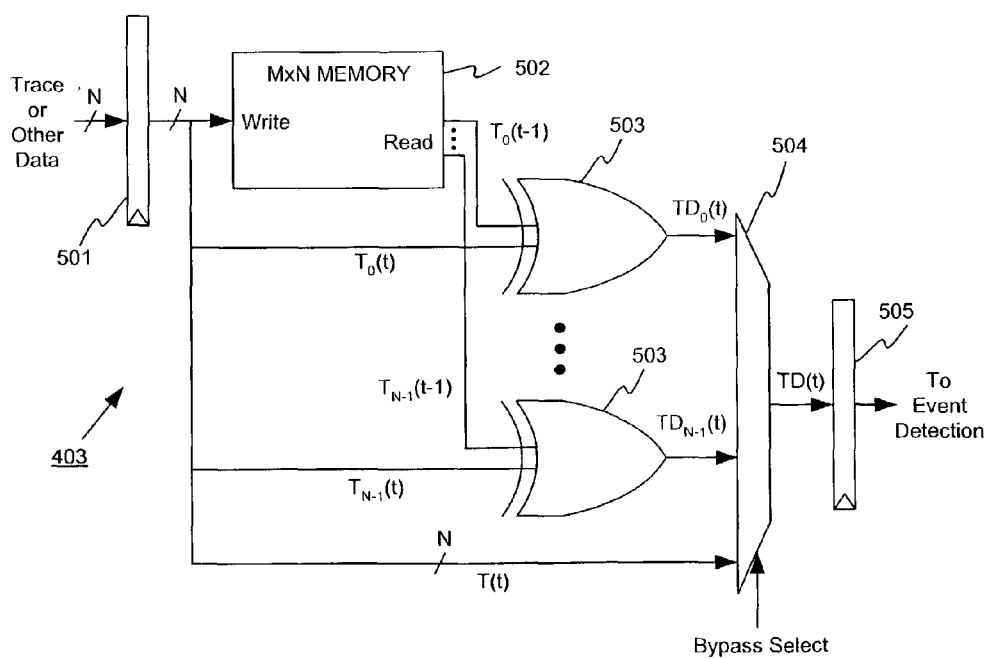
FIG. 5 is a circuit diagram of an illustrative embodiment of a delta detector for receiving the output of a scan chain in accordance with at least one aspect of the present invention.

Delta Detection

Where delta compression or other similar compression is used, it is useful to detect when data has changed from bit to bit. It may further be desirable to perform such detection quickly, even in real time while the emulator 101 is emulating. FIG. 5 shows an illustrative delta detector 403 that detects whether a change, or delta, has occurred in trace data (or in any other data that is provided to it such as design inputs and/or design outputs). In the present illustration, delta detection of trace data will be discussed, however this discussion applies to any data applied to the delta detector 403. The delta detector 403 may be coupled to an output of a scan chain in an emulation chip, receiving trace data (and/or other data) from the scan chain. The delta detector 403 may therefore be part of the interface 402. The trace data may be sent to the delta detector 403 as N parallel sets of length M (or to put it another way, a stream or other set of M data points each N bits wide). N may be one or may be greater than one. The trace data may be received by a flip-flop 501, register, buffer, and/or other temporary storage element (or N parallel temporary storage elements). The trace data may then be forwarded to a memory 502. The memory 502 may be a dual-port or single-port memory, and may preferably be able to store at least (M×N) bits such that the entire trace set for one user clock cycle may be stored, although the memory 502 may be of any size. The memory 502 may then read out the stored trace data as N trace sets each input into one of N parallel exclusive-or (XOR) logic gates 503.

For each trace set input into one of the XOR logic gates 503, a corresponding trace set at time t (e.g., corresponding to a particular user clock cycle at time t) may be read out of the memory 502 and input into the same one of the XOR logic gates 503, lagging by one user clock cycle (i.e., t−1). In other words, if one of the trace sets is denoted as $T_n(t)$, where n is the set number and t is the particular sample number at time t, then the inputs to the corresponding one of the XOR logic gates for that set would be $T_n(t)$ and $T_n(t-1)$. The output of the corresponding XOR logic gate is thus the difference between $T_n(t)$ and $T_n(t-1)$. This difference will be called herein "trace delta data," in the form of a set of trace delta sets $TD_n(t)$. If the two inputs to the corresponding XOR logic gate 503 are equal, then the output $TD_n(t)$ of that XOR logic gate 503 is zero. If the two inputs are not equal, then the output $TD_n(t)$ of the corresponding XOR logic gate 503 is one. Of course, by inverting the outputs of the XOR logic gates 503, or by using other variations, one may create a delta detector that outputs a zero when there is a change in the trace data and a one when there is no change. The particular content of the trace delta set data $TD_n(t)$ is unimportant as long as it indicates whether there has been a change in the corresponding incoming trace set $T_n(t)$ since the same trace set $T_n(t-1)$ for the previous sample in time. In either case, a delta detector has been effectively created for detecting whether there has been a change in a bit of trace data since the previous bit of trace data and outputting a signal indicating as such.

The outputs $TD_n(t)$ of the plurality of parallel XOR logic gates 503 may be time-multiplexed together using a multiplexor 504 to create one or more time-multiplexed bit streams of trace delta data TD(t). The output of the multiplexor 504 may be provided to the input of a flip-flop 505, register, buffer, and/or other temporary storage element. The output of the multiplexor 504 may be selected at any time to be either the trace delta data TD(t) or the original trace data T(t) in accordance with a bypass select signal. This may be useful where it is desired that the original trace data T(t), or a portion thereof, be outputted intermittently (e.g., periodically or aperiodically) in order to provide snapshots of the raw trace data as discussed further herein.

Figure 6:
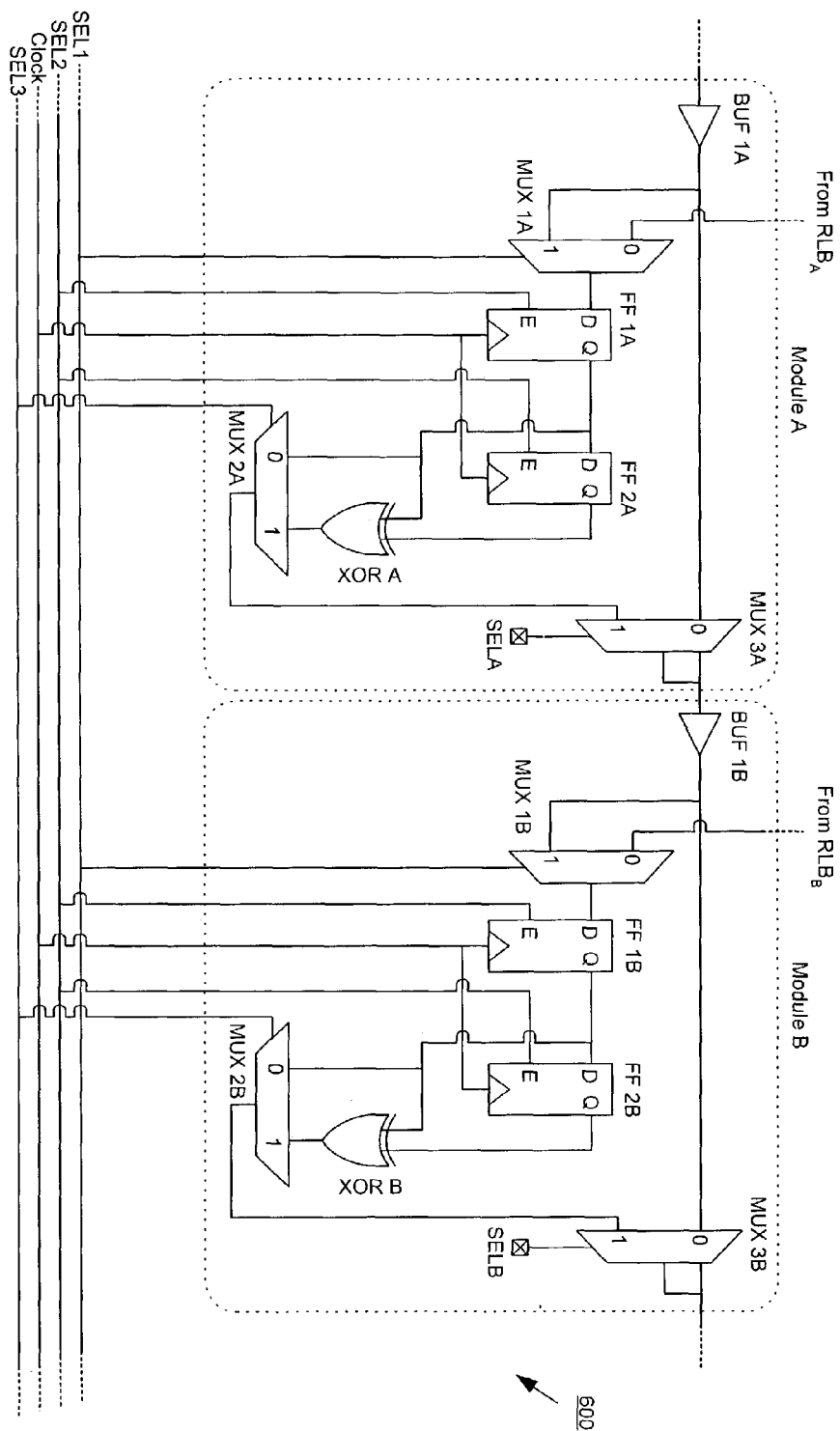
FIG. 6 is a circuit diagram of a portion of an illustrative embodiment of a scan chain with an integrated delta detector in accordance with at least one aspect of the present invention.

Referring to FIG. 6, according to another illustrative embodiment, the delta detector may be integrated into one or more scan chains of an emulation chip. A scan chain 600 may include one or more scan chain portions (also known herein as "modules") coupled in series. Each module may receive the output of a different reconfigurable logic block $RLB_A$, $RLB_B$, etc., or a portion thereof. Illustrative module A may include one or more buffers BUF 1A, BUF 2A; one or more multiplexors MUX 1A, MUX 2A, MUX 3A; one or more flip-flops FF 1A, FF 2A, and/or one or more XOR logic gates XOR A. Module B may also include one or more buffers BUF 1B; one or more multiplexors MUX 1B, MUX 2B, MUX 3B; one or more flip-flops FF 1B, FF 2B, and/or one or more XOR logic gates XOR B. Although not shown in FIG. 6, the scan chain 600 may include additional modules, such as for example a total of thirty-two modules or more.

Although the discussion in this paragraph is with regard to module A, it applies equally to the other modules of the scan chain 600. The corresponding $RLB_A$ may generate trace data that is received by the multiplexor MUX 1A. Depending upon how the multiplexor MUX 1A is configured in accordance with signal SEL1, it may pass the trace data on through the flip-flop FF 1A and into the flip-flop FF 2A. The trace data may also be passed on directly to a first input of the XOR logic gate XOR A. The trace data passing through the flip-flop FF 2A may be delayed by a clock cycle and then passed on to a second input of the XOR logic gate XOR A. Thus, similar to the delta detector of FIG. 5, the XOR logic gate XOR A outputs a binary bit set to one where the trace data for a particular RLB has changed over one clock cycle, and a zero where the trace data has not changed. The multiplexor MUX 2A, depending upon how it is configured in accordance with signal SEL3, may pass the output of the XOR logic gate XOR A to the input of the multiplexor MUX 3A. Depending upon how the multiplexor MUX 3A is configured in accordance with signal SELA, it may pass the output of the XOR logic gate XOR A to the input buffer BUF 1B of the next module B.

The various SEL signals work as follows in this illustrative embodiment. SEL1 determines whether the multiplexors MUX 1A, MUX 1B allow the trace data from their respective RLB or the data from the previous module to pass. SEL2 determines whether the flip-flops FF 1A, FF 1B are enabled. SEL3 determines whether the multiplexors MUX 2A, MUX 2B pass the original trace data or the trace delta data outputted from the XOR logic gates XOR A, XOR B. SEL3 may be intermittently (periodically or aperiodically) selected to allow the original trace data to be outputted by the scan chain 600 on less than all of the clock cycles. For example, the original trace data may be output from the scan chain 600 every one thousand clock cycles. SELA, SELB determine whether their respective multiplexors MUX 3A, MUX 3B pass the data from the previous module or the output of the respective multiplexors 2A, 2B. The scan chain 600 may further receive one or more clock signals for maintaining synchronization, and may be responsive to the clock signals for reading the states of RLBs and/or outputting data.

As discussed previously, a delta detector may be used to detect deltas in data such as trace data, design inputs, and/or design outputs. The delta detector may output one or more signals indicating where in the input data the deltas are located. Such indication may take the form of outputting a bit set to one where a delta is detected and a bit set to zero where a delta is not detected. Alternatively, a bit set to zero may be used to indicate a delta and a bit set to one may be used to indicate the lack of a delta. In either case, it may be desirable at this point to count the number of detected deltas and/or to generate addresses associated with the locations of the detected deltas. The delta count and the delta addresses may be used to aid in compression, as further described below.

Figure 8:
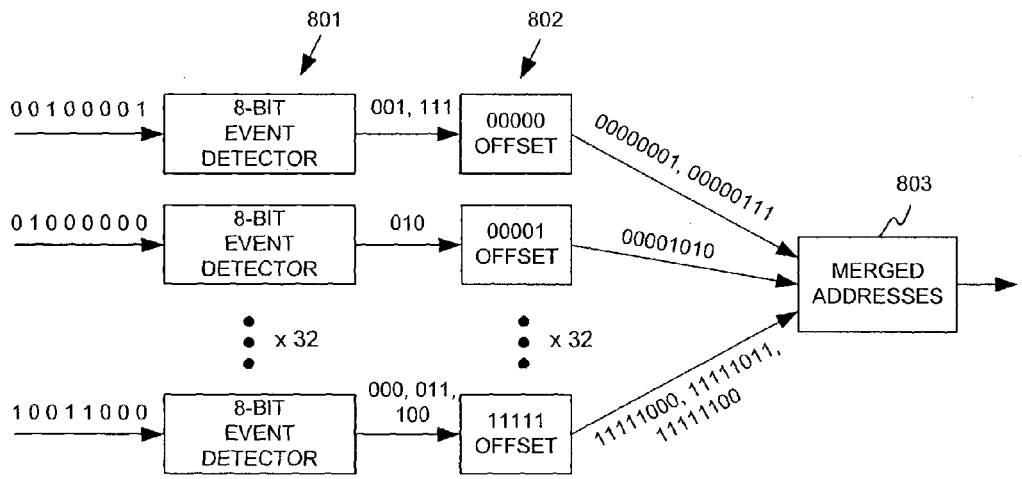
FIG. 8 is a functional block diagram of an illustrative embodiment of an event detector in accordance with at least one aspect of the present invention.

Referring to FIG. 8, an illustrative set of "event detectors" 801 (or, alternatively, a single event detector) are shown that generate addresses of the deltas previously detected from the output of the delta detector 403 or 600. The illustrative event detector(s) herein detect bits set to one, however the event detector(s) may be easily configured to instead detect bits set to zero or any other event. In general, an event is a bit or bit pattern associated with a delta detected by the delta detector. For purposes of illustration only, this specification assumes that the event detectors 801 detect bits set to one. Each of the event detectors 801 output addresses of the bits set to one that it detects. For example, where the input set has N=256 bits, each of the event detectors 801 may receive a different slice of the input set, such as thirty-two slices each having eight bits. Each of the event detectors 801 therefore may generate a three-bit sub-address corresponding to each bit position in the corresponding slice of the input set that is set to one. Thus, for instance, where the input portion is [0 0 1 0 0 0 0 1] and the bit positions are in sequence from zero to seven, the event detector 801 receiving this input portion may output sub-addresses of [0 1 1] (bit position 3) and [1 1 1] (bit position 7).

The sub-addresses generated by the event detectors 801 may further each be offset 802 by a constant value to generate a full address. For example, where three-bit sub-addresses are used for eight-bit input sets, one or more bits may be added to each of the sub-addresses to bring the total number of bits of the addresses to a sufficient number of bits to uniquely identify a bit out of all the global M input sets. Thus, each of the offsets 802 may add a different constant set of bits. For instance, a first offset may add the bits [0 0 0 0 0] to all received sub-addresses, such that where the sub-address being input is [0 0 1], the resulting unique address would be [0 0 0 0 0 0 0 1]. Another offset may add the bits [0 1 0 0 0] to all received sub-addresses, such that where the sub-address being input is [0 1 0], the resulting unique address would be [0 1 0 0 0 0 1 0]. The addresses output by the offsets 802 preferably should have sufficient bits to uniquely identify N bit positions. For instance, where N=256, each address should preferably be at least eight bits in length to account for 256 possible bit positions. Once the full addresses are generated, they may be merged (e.g., demultiplexed) 803 into one or more bit streams as desired. As will be described further below, these global addresses may be used to aid in compression.

Figure 12:
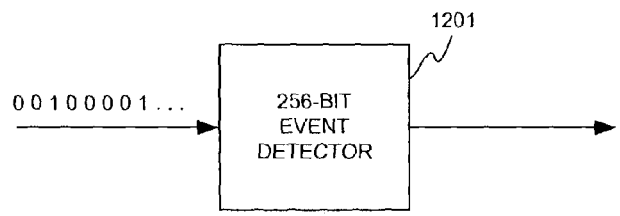
FIG. 12 is a functional block diagram of an illustrative embodiment of an event detector in accordance with at least one aspect of the present invention.

According to a further embodiment as shown in FIG. 12, a single event detector 1201 may be used for a relatively large number of bits in parallel. In this example, the event detector 1201 can process 256 bits in parallel to produce the same output as the output of 803 in FIG. 8.

The event detector(s) 801 and the event detector 1201 may be configured in a variety of ways. For example, the event detectors 801, 1201 may be configured as full crossbars or partial crossbars (e.g., a systolic event detector). Where the event detectors 801, 1201 are configured as a full crossbar, the full crossbar may include a plurality of layers of multiplexors. Each multiplexor may process one of the input set bits set to one and may output the address of the bit set to one.

Figure 13:
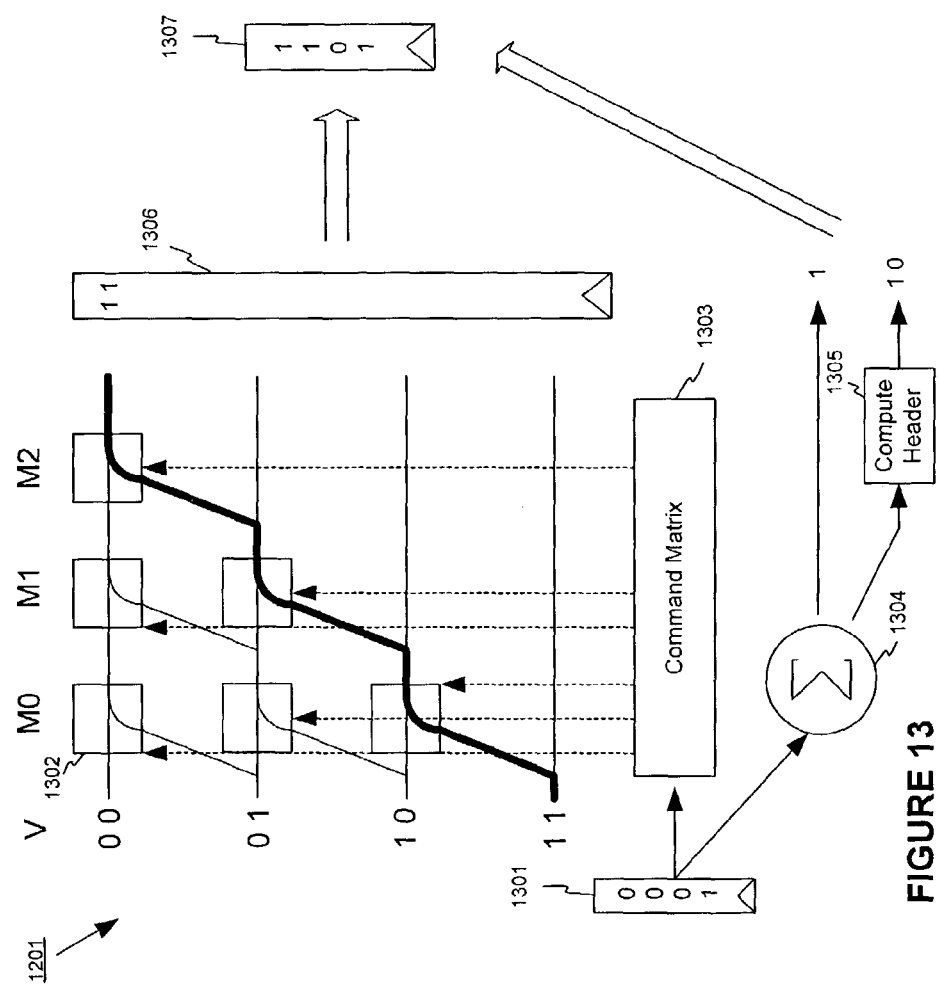
FIG. 13 is a functional block diagram of an illustrative embodiment of a systolic partial crossbar event detector in accordance with at least one aspect of the present invention.

The full crossbar configuration provides a relatively simple approach to detecting events, but may not always be the most efficient configuration. Instead, a systolic configuration—a partial crossbar—may be used. Referring to FIG. 13, the event detector 1201 may be configured as a partial crossbar and may include a plurality of multiplexors 1302, such as 2:1 multiplexors. A register 1301 or other data storage device, may hold an input set V. In the shown embodiment, the set V would be [1 0 0 0]. The subaddresses for input set V may be forwarded through the network of multiplexors 1302. Also, the input set V may be forwarded to a command matrix 1303 that generates control commands for the multiplexors 1302. The multiplexors 1302 may be arranged as a series of layers M0, M1, M2, etc. as necessary. In general there may be (width of V) −1 layers. The multiplexors 1302 may further be arranged as a series of rows that may be associated with a different subaddress of the set V.

In the shown embodiment, there are three layers of multiplexors M0 through M2, which would be the worst-case path. Also, in the shown embodiment, the subaddresses [0 0], [0 1], and [1 0] are each coupled to a different multiplexor in the M0 layer. The subaddress [1 1] in this case is not associated with a multiplexor row. For example, where V is eight bits wide, the worst-case path would be seven layers of multiplexors 1302: M0 through M6.

Each multiplexor 1302 may be configured to either pass a received subaddress or switch the subaddress to a different row. The thick-lined path shown in FIG. 13 shows the path that the subaddress [1 1] may take in the present illustrative embodiment. This is because the set V includes a single bit set to one at subaddress [1 1]. Thus, subaddresses of the bits set to one (or zero, depending upon the event to be detected) will travel row by row upward in FIG. 13 until they cannot travel any further. The multiplexors 1302 may then ultimately output the subaddresses of the bits set to one, as shown by the thick-lined path.

Once the subaddress(es) have been switched through the multiplexors 1302 (in this example, subaddress [1 1] corresponding to the bit in V set to one), they may be stored in a register 1306 or other storage device. While the data is traveling through the multiplexors 1302, the input set V may also be forwarded to a summer 1304 that sums the bits in V (in this case, the sum equals one). The result of the summer 1304 may be forwarded to logic 1305 that computes a header indicating whether V is compressible. This determination may be made based upon whether the result of the summer 1304 is less than a threshold number. In the present example, the logic 1305 may generate a header such as [1 0]. The header and the data stored in the register 1306 may be combined into the same or a different register 1307 to result in [1 0 1 1], from highest order bit to lowest order bit.

The tables below illustrate a larger illustrative case where V is eight bits wide. In particular, Table 1 shows an example where V=[1 1 0 0 0 0 1 0], from highest order bit V7 to lowest order bit V0, and shows the flow of data through the layers M0 through M6 of multiplexors. Tables 2-8 show how the commands to operate the various multiplexors may be generated. For example, the multiplexor at subaddress row 000 and layer M0 may receive a command L00 based on a logical combination of V0' and V1, where V0'=NOT(V0). And, the multiplexor at subaddress row 001 and layer M1 may receive a commend based on a logical combination of V0, as well as command L00 and the command for the multiplexor at subaddress 001 and layer M0 (i.e., L01). In this embodiment, where a command for a particular multiplexor results in a bit set to zero, that multiplexor lets the input signal pass without changing rows. Where the command is a bit set to one, then that multiplexor switches the input signal to the next path (in the up direction in the case of FIG. 13).

TABLE 1

| Set | Subaddress | M0 | M1 | M2 | M3 | M4 | M5 | M6 |
|---|---|---|---|---|---|---|---|---|
| 0 | 0 | 000 | 1 | 0 | 0 | 0 | 0 | 0 | 0 |
| 1 | 1 | 001 | 0 | 0 | 0 | 0 | 1 | 0 | |
| 2 | 0 | 010 | 0 | 0 | 0 | 1 | 1 | | |
| 3 | 0 | 011 | 0 | 0 | 1 | 1 | | | |

TABLE 1-continued

| Set | Subaddress | M0 | M1 | M2 | M3 | M4 | M5 | M6 |
|---|---|---|---|---|---|---|---|---|
| 4 | 0 | 100 | 0 | 1 | 1 | | | |
| 5 | 0 | 101 | 1 | 1 | | | | |
| 6 | 1 | 110 | 1 | | | | | |
| 7 | 1 | 111 | | | | | | |

TABLE 2

M0

| Subaddress | Logic |
|---|---|
| 000 | L00 = V0' AND V1 |
| 001 | L01 = [V0 AND V1]' AND V2 |
| 010 | L02 = [V0 AND V1 AND V2]' AND V3 |
| 011 | L03 = [V0 AND V1 AND V2 AND V3]' AND V4 |
| 100 | L04 = [V0 AND V1 AND V2 AND V3 AND V4]' AND V5 |
| 101 | L05 = [V0 AND V1 AND V2 AND V3 AND V4 AND V5]' AND V6 |
| 110 | L06 = [V0 AND V1 AND V2 AND V3 AND V4 AND V5 AND V6]' AND V7 |
| 111 | N/A |

TABLE 3

M1

| Subaddress | Logic |
|---|---|
| 000 | L10 = [V0 OR L00]' AND L01 |
| 001 | L11 = [V1 XNOR L00] AND [L01 XNOR L10] AND L02 |
| 010 | L12 = [V2 XNOR L01] AND [L02 XNOR L11] AND L03 |
| 011 | L13 = [V3 XNOR L02] AND [L03 XNOR L12] AND L04 |
| 100 | L14 = [V4 XNOR L03] AND [L04 XNOR L13] AND L05 |
| 101 | L15 = [V5 XNOR L04] AND [L05 XNOR L14] AND L06 |
| 110 | N/A |
| 111 | N/A |

TABLE 4

M2

| Subaddress | Logic |
|---|---|
| 000 | L20 = [V0 OR L00 OR L10]' AND L11 |
| 001 | L21 = [V1 XNOR L00] AND [L01 XNOR L10] AND [L11 XNOR L20] AND L12 |
| 010 | L22 = [V2 XNOR L01] AND [L02 XNOR L11] AND [L12 XNOR L21] AND L13 |
| 011 | L23 = [V3 XNOR L02] AND [L03 XNOR L12] AND [L13 XNOR L22] AND L14 |
| 100 | L24 = [V4 XNOR L03] AND [L04 XNOR L13] AND [L14 XNOR L23] AND L15 |
| 101 | N/A |
| 110 | N/A |
| 111 | N/A |

TABLE 5

M3

| Subaddress | Logic |
|---|---|
| 000 | L30 = [V0 OR L00 OR L10 OR L20]' AND L21 |
| 001 | L31 = [V1 XNOR L00] AND [L01 XNOR L10] AND [L11 XNOR L20] AND [L21 XNOR L30] AND L22 |
| 010 | L32 = [V2 XNOR L01] AND [L02 XNOR L11] AND [L12 XNOR L21] AND [L22 XNOR L31] AND L23 |

TABLE 5-continued

M3

| Subaddress | Logic |
|---|---|
| 011 | L33 = [V3 XNOR L02] AND [L03 XNOR L12] AND [L13 XNOR L22] AND [L23 XNOR L32] AND L24 |
| 100 | N/A |
| 101 | N/A |
| 110 | N/A |
| 111 | N/A |

TABLE 6

M4

| Subaddress | Logic |
|---|---|
| 000 | L40 = [V0 OR L00 OR L10 OR L20 OR L30]' AND L31 |
| 001 | L41 = [V1 XNOR L00] AND [L01 XNOR L10] AND [L11 XNOR L20] AND [L21 XNOR L30] AND [L31 XNOR L40] AND L32 |
| 010 | L42 = [V2 XNOR L01] AND [L02 XNOR L11] AND [L12 XNOR L21] AND [L22 XNOR L31] AND [L32 XNOR L41] AND L33 |
| 011 | N/A |
| 100 | N/A |
| 101 | N/A |
| 110 | N/A |
| 111 | N/A |

TABLE 7

M5

| Subaddress | Logic |
|---|---|
| 000 | L50 = [V0 OR L00 OR L10 OR L20 OR L30 OR L40]' AND L41 |
| 001 | L51 = [V1 XNOR L00] AND [L01 XNOR L10] AND [L11 XNOR L20] AND [L21 XNOR L30] AND [L31 XNOR L40] AND [L41 XNOR L50] AND L42 |
| 010 | N/A |
| 011 | N/A |
| 100 | N/A |
| 101 | N/A |
| 110 | N/A |
| 111 | N/A |

TABLE 8

M6

| Subaddress | Logic |
|---|---|
| 000 | L60 = [V0 OR L00 OR L10 OR L20 OR L30 OR L40 OR L50]' AND L51 |
| 001 | N/A |
| 010 | N/A |
| 011 | N/A |
| 100 | N/A |
| 101 | N/A |
| 110 | N/A |
| 111 | N/A |

In an alternative embodiment, a full crossbar approach may be used. Shown below is an illustrative VERILOG routine for computing the command signals for a full crossbar 128:1 multiplexor event detector that detects bits set to one. In these example, seven command bits per mux would be used. In the below routine, data_com_i is the incoming 128 bit word, and a,b,c,d,e,f,g, and h are intermediate signals. Also, cmd[6:0]

are the commands applied to the multiplexor, and are obtained by logically ORing together the previous signals.

```
module LOG_COM (data_com_i, cmd);
    input [127:0] data_com_i;
    output [6:0] cmd;
    reg [127:0] a, b;
    reg [63:0] c;
    reg [31:0] d;
    reg [15:0] e;
    reg [7:0] f;
    reg [3:0] g;
    reg [1:0] h;
    integer j;
    always @(a,b,c,d,e,f,g,data_com_i) begin
        a[0]= 1'b1;
        for (j=1;j<=127; j=j+1)
        a[j]=a[j-1]&~data_com_i[j-1];
            for (j=0;j<=127; j=j+1)
        b[j]=a[j]&data_com_i[j];
            for (j=0;j<=63; j=j+1)
        c[j]=b[2*j]|b[2*j+1];
            for (j=0;j<=31; j=j+1)
        d[j]=c[2*j]|c[2*j+1];
            for (j=0;j<=15; j=j+1)
        e[j]=d[2*j]|d[2*j+1];
            for (j=0;j<=7; j=j+1)
        f[j]=e[2*j]|e[2*j+1];
            for (j=0;j<=3; j=j+1)
        g[j]=f[2*j]|f[2*j+1];
            for (j=0;j<=1; j=j+1)
        h[j]=g[2*j]|g[2*j+1];
    end // always
    assign cmd[0] = (
b[0]|b[2]|b[4]|b[6]|b[8]|b[10]|b[12]|b[14]|b[16]|b[18]|b[20]|b[22]|
b[24]|b[26]|b[28]|b[30]|b[32]|b[34]|b[36]|b[38]|b[40]|b[42]|b[44]|
b[46]|b[48]|b[50]|b[52]|b[54]|b[56]|b[58]|b[60]|b[62]|b[64]|b[66]|
b[68]|b[70]|b[72]|b[74]|b[76]|b[78]|b[80]|b[82]|b[84]|b[86]|b[88]|
b[90]|b[92]|b[94]|b[96]|b[98]|b[100]|b[102]|b[104]|b[106]|b[108]|
b[110]|b[112]|b[114]|b[116]|b[118]|b[120]|b[122]|b[124]|b[126] )
| ~(
b[1]|b[3]|b[5]|b[7]|b[9]|b[11]|b[13]|b[15]|b[17]|b[19]|b[21]|b[23]|
b[25]|b[27]|b[29]|b[31]|b[33]|b[35]|b[37]|b[39]|b[41]|b[43]|b[45]|
b[47]|b[49]|b[51]|b[53]|b[55]|b[57]|b[59]|b[61]|b[63]|b[65]|b[67]|
b[69]|b[71]|b[73]|b[75]|b[77]|b[79]|b[81]|b[83]|b[85]|b[87]|b[89]|
b[91]|b[93]|b[95]|b[97]|b[99]|b[101]|b[103]|b[105]|b[107]|b[109]|
b[111]|b[113]|b[115]|b[117]|b[119]|b[121]|b[123]|b[125]|b[127] );
    assign cmd[1] = (
c[0]|c[2]|c[4]|c[6]|c[8]|c[10]|c[12]|c[14]|c[16]|c[18]|c[20]|c[22]|
c[24]|c[26]|c[28]|c[30]|c[32]|c[34]|c[36]|c[38]|c[40]|c[42]|c[44]|
c[46]|c[48]|c[50]|c[52]|c[54]|c[56]|c[58]|c[60]|c[62] )
| ~(
c[1]|c[3]|c[5]|c[7]|c[9]|c[11]|c[13]|c[15]|c[17]|c[19]|c[21]|c[23]|
c[25]|c[27]|c[29]|c[31]|c[33]|c[35]|c[37]|c[39]|c[41]|c[43]|c[45]|
c[47]|c[49]|c[51]|c[53]|c[55]|c[57]|c[59]|c[61]|c[63] );
    assign cmd[2] = (
d[0]|d[2]|d[4]|d[6]|d[8]|d[10]|d[12]|d[14]|d[16]|d[18]|d[20]|d[22]|
d[24]|d[26]|d[28]|d[30] )
| ~(
d[1]|d[3]|d[5]|d[7]|d[9]|d[11]|d[13]|d[15]|d[17]|d[19]|d[21]|d[23]|
d[25]|d[27]|d[29]|d[31] );
    assign cmd[3] = ( e[0]|e[2]|e[4]|e[6]|e[8]|e[10]|e[12]|e[14] ) | ~(
e[1]|e[3]|e[5]|e[7]|e[9]|e[11]|e[13]|e[15] );
    assign cmd[4] = ( f[0]|f[2]|f[4]|f[6] ) | ~( f[1]|f[3]|f[5]|f[7] );
    assign cmd[5] = ( g[0]|g[2] ) | ~( g[1]|g[3] );
    assign cmd[6] = h[0] | ~h[1];
endmodule
```

An added complexity is operational frequency. At higher frequencies, such as 200 MHz, it may be desirable to pipeline the network, for either the systolic or full crossbar embodiments. This would make delta detection more sequential than expected, since far end bits may come out of the network at a later time than near end bits. For large delta detection, a full crossbar may have less stages than systolic delta detection, so a full crossbar approach may use less pipelining and may thus be less sequential. When pipelining, it should be remembered that a switch or multiplexor should be configured before it is traversed by data. There may be a first 'wave' of command signals (from the command matrix or other controller) going through a command pipeline, and a second wave of data bits. The depth of the command equations may vary, causing timing closure problems that may be resolved or reduced with pipelining.

A Numerical Example

A specific example of how trace data may be compressed is now discussed. Assume that an emulation system includes a plurality of reconfigurable logic chips, and that each reconfigurable logic chip has N=256 parallel scan chains each providing either a trace set or a trace delta set (depending upon whether a delta detector is integrated into each scan chain or coupled to the end of each scan chain). Assuming for the moment that a delta detector is coupled to the end of each scan chain, and each scan chain generates a single trace set for each user clock cycle. In the present example, assume that each trace set for each user clock cycle is M=16 bits in length. Thus, each trace set would contain M=16 bit positions per user clock cycle. Each bit position m corresponds to a different state element coupled along the scan chain within the reconfigurable logic chip.

With the above assumptions in mind, Table 9 shows an example of trace sets that may be generated within one reconfigurable logic chip over one user clock cycle t=0. For instance, trace set n=3, also known as $T_3$ in FIG. 5, contains the data [0 0 1 1 1 1 0 0 1 1 1 1 1 1 0 0]. Also, trace set $T_0$ contains the data [1 1 1 1 1 0 0 1 1 1 1 1 1 1 1 1].

TABLE 9

| | | Bit Position m (M = 16) for t = 0 | | | | | | | | | | | | | | | |
|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 |
| Trace Data Set | 0 | 1 | 1 | 1 | 1 | 1 | 0 | 0 | 1 | 1 | 1 | 1 | 1 | 1 | 1 | 1 | 1 |
| Number n | 1 | 0 | 0 | 1 | 0 | 0 | 0 | 0 | 1 | 0 | 0 | 0 | 0 | 0 | 0 | 0 | 0 |
| (N = 256) | 2 | 1 | 1 | 1 | 1 | 1 | 1 | 1 | 1 | 1 | 1 | 1 | 1 | 1 | 1 | 1 | 1 |
| | 3 | 0 | 0 | 1 | 1 | 1 | 1 | 0 | 0 | 1 | 1 | 1 | 1 | 1 | 1 | 0 | 0 |
| | 4 | 0 | 0 | 0 | 0 | 0 | 0 | 0 | 0 | 0 | 0 | 0 | 0 | 0 | 0 | 0 | 0 |
| | ... | | | | | | | | | ... | | | | | | | |
| | 255 | 0 | 0 | 0 | 1 | 1 | 1 | 1 | 1 | 1 | 1 | 1 | 1 | 1 | 0 | 0 | 0 |

Table 10 shows an example of trace sets that may be generated within one reconfigurable logic chip over one user clock cycle t=1.

TABLE 10

| | | Bit Position m (M = 16) for t = 1 | | | | | | | | | | | | | | | |
|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 |
| Trace Data Set | 0 | 1 | 1 | 1 | 1 | 1 | 1 | 0 | 0 | 1 | 1 | 1 | 1 | 1 | 1 | 1 | 1 |
| Number n | 1 | 0 | 0 | 0 | 1 | 0 | 0 | 0 | 0 | 1 | 0 | 0 | 0 | 0 | 0 | 0 | 0 |
| (N = 256) | 2 | 1 | 1 | 1 | 1 | 1 | 1 | 1 | 1 | 1 | 1 | 1 | 1 | 1 | 1 | 1 | 1 |
| | 3 | 0 | 0 | 0 | 1 | 1 | 1 | 1 | 0 | 0 | 1 | 1 | 1 | 1 | 1 | 0 | 0 |
| | 4 | 0 | 0 | 0 | 0 | 0 | 0 | 0 | 0 | 0 | 0 | 0 | 0 | 0 | 0 | 0 | 0 |
| | ... | | | | | | | | | ... | | | | | | | |
| | 255 | 0 | 0 | 0 | 1 | 1 | 1 | 1 | 1 | 1 | 1 | 1 | 1 | 1 | 0 | 0 | 0 |

Table 11 represents the trace delta sets that are generated by the delta detectors in the present example. Table 11 shows, for example, that the trace delta set $TD_3$ (corresponding to trace set $T_3$ from Table 9) contains the binary data [0 0 1 0 0 0 1 0 1 0 0 0 0 0 1 0]. Trace delta set $TD_0$ contains the binary data [0 0 0 0 0 1 0 1 0 0 0 0 0 0 0 0]. In this example, both $TD_0$ and $TD_3$ contain substantially more zeros than their counterparts $T_0$ and $T_3$. In general for trace data obtained from an emulator, it can be expected that delta detection will result in a substantial percentage of the trace delta set bits being the same (in this case, zero). This means that compression of the trace delta sets generally becomes much more efficient than compression of the trace sets. The result of the delta detectors as shown in Table 11 in this example is effectively a two-dimensional array of data that has been prepared for more efficient compression.

TABLE 11

|  |  | Bit Position m (M = 16) for t = 1 |   |   |   |   |   |   |   |   |   |    |    |    |    |    |    |
|---|---|---|---|---|---|---|---|---|---|---|---|----|----|----|----|----|----|
|  |  | 0 | 1 | 2 | 3 | 4 | 5 | 6 | 7 | 8 | 9 | 10 | 11 | 12 | 13 | 14 | 15 |
| Trace Delta Data | 0 | 0 | 0 | 0 | 0 | 0 | 1 | 0 | 1 | 0 | 0 | 0 | 0 | 0 | 0 | 0 | 0 |
| Set Number n | 1 | 0 | 0 | 1 | 1 | 0 | 0 | 0 | 1 | 1 | 0 | 0 | 0 | 0 | 0 | 0 | 0 |
| (N = 256) | 2 | 0 | 0 | 0 | 0 | 0 | 0 | 0 | 0 | 0 | 0 | 0 | 0 | 0 | 0 | 0 | 0 |
|  | 3 | 0 | 0 | 1 | 0 | 0 | 0 | 1 | 0 | 1 | 0 | 0 | 0 | 0 | 0 | 1 | 0 |
|  | 4 | 0 | 0 | 0 | 0 | 0 | 0 | 0 | 0 | 0 | 0 | 0 | 0 | 0 | 0 | 0 | 0 |
|  | ... |   |   |   |   |   |   |   |   |   |   |    |    |    |    |    |    |
|  | 255 | 0 | 0 | 0 | 1 | 0 | 0 | 0 | 0 | 0 | 0 | 0 | 0 | 0 | 1 | 0 | 0 |

Figure 9:
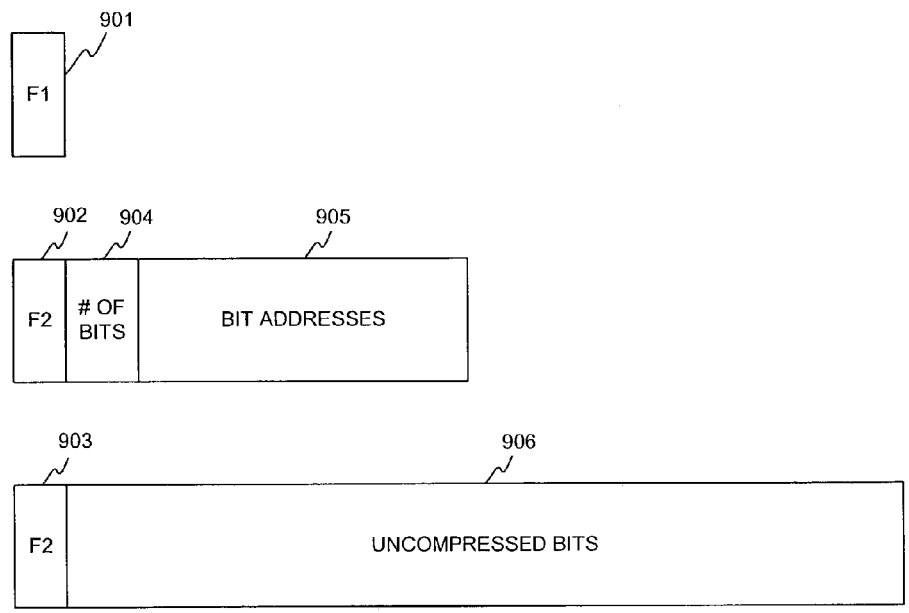
FIGS. 9 and 10 are graphical representations of data that may be generated as a result of compression in accordance with at least one aspect of the present invention.

The trace delta data may be compressed in a variety of ways. For example, compression may take place across the trace delta sets, i.e., on a column-by-column basis in Table 11. Alternatively, compression may take place within trace delta sets, i.e., on a row-by-row basis in Table 11. In one illustrative embodiment that compresses across trace delta sets, M (in this example, sixteen) compressed data sets may be generated, each corresponding to one of the bit position columns of Table 11. Thus, a first set of data containing the first bit position (m=0) of each of the M trace delta data sets is compressed, a second set of data containing the second bit position (m=1) of each of the M trace delta data sets is compressed, and so on. Referring to FIG. 9, flags, such as headers, may be added to some or all of the compressed data sets to indicate the compression status, type of compression, length of the data set, and/or other characteristics. The flags may be of any size or format. For instance, where the delta data to be compressed is all zeros, then that data may be represented only as a first flag 901 (such as a single zero bit). A second flag 902 (such as binary [1 0], for example) may indicate that the immediately following byte 904 indicates the number of total bits in a particular set of compressed data that are set to one. Then the addresses 905 (e.g., where each address may be the index n) of each trace set corresponding to those bits set to one may follow. A third flag 903 (such as binary [1 1], for example) may indicate that the immediately following N bits 906 are uncompressed.

An illustrative result of such compression is shown in Table 12. Assume that all of the bits in the m=0 column of Table 11 are set to zero. In such a case, as shown by Table 12, the corresponding compressed data set m=0 would simply contain a single zero-bit flag. As another example, the m=2 column of Table 11 contains several bits set to one including those bits generated by trace data sets n=1 and n=3. The values of n may be considered identifiers (e.g., addresses) of the trace data sets, and so the identifier for the n=1 trace delta data set may be the binary value of 1 (binary [0 0 0 0 0 0 0 1]) and the address (which may be generated as described in connection with FIG. 9) for the n=3 trace delta data set may be the binary value of decimal 3 (binary [0 0 0 0 0 0 1 1]). The compressed data set m=2 may thus contain a flag 902 (e.g., binary [1 0]) indicating that compressed data is to follow, as well as an indication 904 of the number of bits set to one in the m=2 column (in this case, assume nine, binary [0 0 0 0 1 0 0 1]), and then the nine addresses for the trace delta sets whose m=2 bits are set to one (including, among others, n=1, or binary [0 0 0 0 0 0 0 1], and n=3, or binary [0 0 0 0 0 1 1]).

TABLE 12

| Compressed Set Number m (M streams) | Content |
|---|---|
| 0 | 0 |
| 1 | 0 |
| 2 | 10 00000001 00000011 ... |
| 3 | 10 00000001 ... 11111111 |
| 4 | 0 |
| ... | ... |
| 8 | 1 1 0 1 0 1 0 ... 0 |
| ... | ... |
| 15 | 0 |

Figure 10:
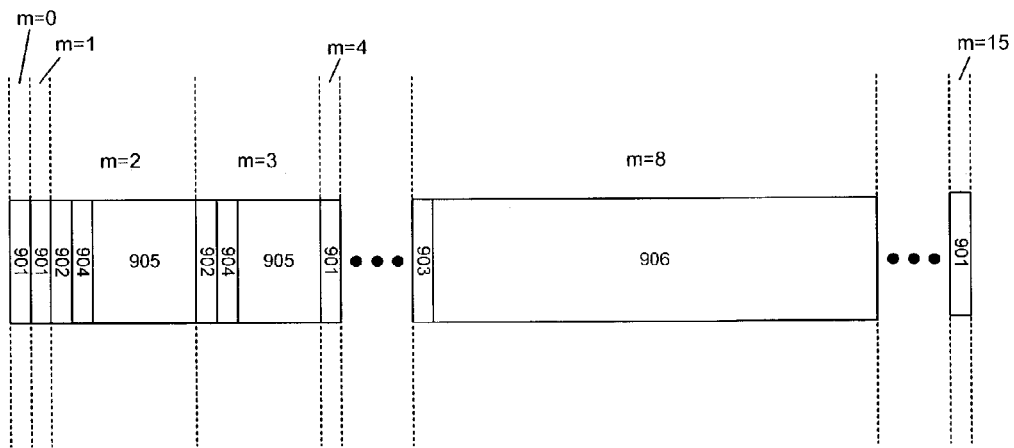

It is assumed for this example that all of the bits in the set m=4 are set to zero. Thus, a minimum number of bits (e.g., one bit) may be used to represent this all-zero state. In this example, a flag of [0] is used to indicate an all-zero state. Where m=8 in the present example, assume that the data changed back and forth sufficiently (i.e., a large number of deltas) such that compression would not be very useful. In Table 12, the flag [1 1] for m=8 thus indicates that the N bits following are uncompressed. This may be desirable where there are a sufficient number of bits set to one such that providing addresses (as where m=2) would actually either not decrease the amount of data, or would even increase the amount of data, required to otherwise express the uncompressed bit set. For instance, where the addresses of the bits in a particular data set m that are set to one are each eight bits long, and N=256, then to compress a delta data set having thirty-three bits set to one may require (8×33)+2=266 bits. It therefore would actually require less data volume in this situation to simply leave the data set m uncompressed (or choose another type of compression) for a total of not more than 256+2=258 bits. In general, it is preferable to compress a data set m in this manner only where $(A \times B)+F+G < (\text{or} \leqq) N$, where A is the length of each trace delta set address, B is the number of bits set to one in data set m, F is the length of the flag used, if any, to represent compressed data, and G is the length of the indicator 904. FIG. 10 illustrates an illustrative format of how the compressed delta data of Table 12 may be expressed.

It has been found that the emulation trace data may be expected to be significantly compressed when compressed as described above. In fact, tests have shown that a typical design produced trace data that was compressible in accordance with the present invention by as much as forty to sixty-fold. It is anticipated that even the typical worst-case compression would be about three-fold.

Compaction and Equalization

During an emulation run, some or all of the state elements in an integrated circuit chip may be traced. As mentioned previously, each integrated circuit chip may include a plurality of scan chains. Each scan chain may be configured to be able to receive trace data from each of a plurality of RLBs. For example, presume that a particular scan chain in a chip is configured to be able to receive trace data from up to X number of RLBs within the chip. However, that scan chain may be configured in a particular scenario to receive trace data from only some of the X RLBs. Thus, in that scenario, less than X RLBs may be traced while the other RLBs for that scan chain are ignored. Where different scan chains on the same chip are configured to trace different numbers of RLBs, the result is a plurality of trace data sets of different lengths. However, as discussed previously, it is desirable (but not required) that the plurality of sets are each of the same bit length. It is easier to compress across trace sets that are each of equal length.

To obtain trace sets of equal length, the scan chain may be configurable to pick and choose certain of the RLBs from which to receive trace data. In the embodiment of FIG. 6 for example, the configuration of MUX 1A and/or MUX 3A determines whether or not trace data from $RLB_A$ will be received by Module A. If MUX 3A is configured to receive input 0 instead of input 1, then Module A, and the trace data from $RLB_A$, are effectively bypassed. By configuring the various MUXes along the scan chain, the scan chain may selectively receive trace data from certain of the RLBs.

Figure 7:
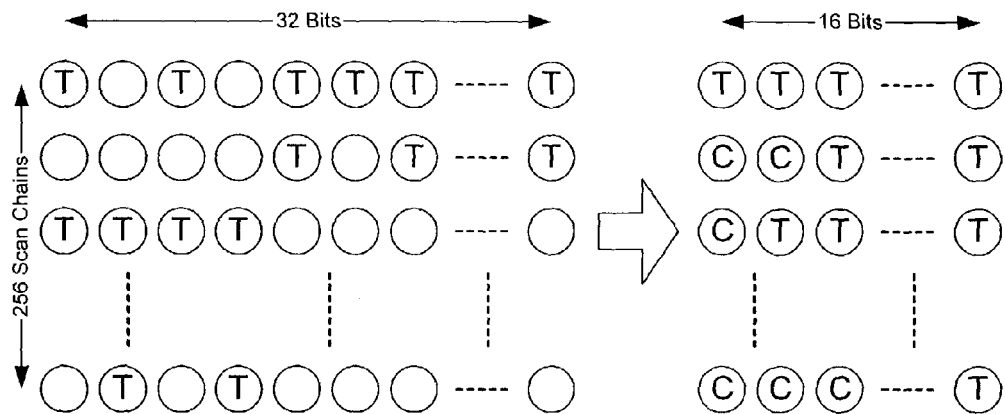
FIG. 7 is a graphical representation of an illustrative embodiment of trace data compaction and equalization in accordance with at least one aspect of the present invention.

A result of bypassing modules of scan chains is shown in FIG. 7. Assume, for example, that each of two hundred fifty-six scan chains of an integrated circuit chip is thirty-two bits in length. That is, each scan chain is configured to be able to receive trace data from up to thirty-two RLBs. Further assume that at least some of the scan chains are configured to actually receive trace data from less than thirty-two of the RLBs. For example, a first scan chain may be configured to receive trace data from only twelve of its RLBs, a second scan chain may be configured to receive trace data from only sixteen of its RLBs, and a third scan chain may be configured to receive trace data from only five of its RLBs. This is illustrated on the left side of FIG. 7, which shows several horizontal rows of circles each representing one of the thirty-two modules of a respective scan chain. Each of the circles may also be thought of as representing a different clocked serial output of the respective scan chain. Circles having the letter "T" within represent trace data, while circles that are blank represent clocked data corresponding to a bypassed scan chain module (i.e., no trace data).

The right side of FIG. 7 illustrates the result of compacting and equalizing the outputs of the scan chains. Assume, for example, that the maximum number of trace data bits (the number of which may be used as the constant M mentioned herein) output from any of the scan chains is sixteen bits. Thus, even though each of the scan chains output thirty-two bits of data, sixteen or less of those bits are trace data bits. The remaining bits (i.e., the blank circles in FIG. 7) are not of interest and can be ignored. The data output from each scan chain (which may be trace data or trace delta data) may be compacted by removing the garbage bits, leaving only the trace data bits. Then, the data output from each scan chain may be equalized by adding constant bits as required to bring them to a total of M (which equals sixteen in this example) bits. The constant bits, which are represented in FIG. 7 as circles containing the letter "C," may be added anywhere within the sequence of trace data, but preferably are added to either the beginning or end of the sequence. For instance, the compacted output of the first scan chain, which has only twelve bits of trace data (or trace delta data), may have added to it four constant bits. The compacted output of the second scan chain, which has sixteen bits of trace data (or trace delta data), does not require any constant bits to be added. The compacted output of the third scan chain, which has five bits of trace data (or trace delta data), would require eleven constant bits added thereto. The result is a plurality of scan chain output sets of the same bit length M. The resulting compacted and equalized sets may then be compressed such as described previously.

While exemplary systems and methods as described herein embodying various aspects of the present invention are shown by way of example, it will be understood, of course, that the invention is not limited to these embodiments. Modifications may be made by those skilled in the art, particularly in light of the foregoing teachings. For example, each of the elements of the aforementioned embodiments may be utilized alone or in combination with elements of the other embodiments. In addition, the invention has been defined using the appended claims, however these claims are exemplary in that the invention is intended to include the elements and steps described herein in any combination or sub combination. It will also be appreciated and understood that modifications may be made without departing from the true spirit and scope of the invention. For example, where bits of data are discussed as being set to zero or one, such zeros and ones may be reversed.

We claim:

1. A computer-implemented method for compressing trace data of an emulator, the method comprising:
receiving trace data from an emulator having reconfigurable hardware, the reconfigurable hardware including a plurality of integrated circuit chips, whereby the emulator can be configured to act as a circuit design that comprises different hardware than the emulator;
generating, based at least in part on the trace data, a plurality of first datasets, each of the plurality of first datasets representing where deltas have occurred in the trace data, wherein deltas represent changes;
generating, based at least in part on the trace data, a plurality of second datasets, each of the plurality of second datasets representing a different cross section than the plurality of first datasets;
compressing at least one of the plurality of second datasets, wherein at least part of the compression is performed on a one of the plurality of integrated circuit chips, wherein a compressed dataset is generated; and
wherein the circuit design can be debugged, at least in part, from the compressed dataset.

2. The method of claim 1, wherein the method act of compressing includes determining for each of the plurality of second datasets whether that one of the plurality of second datasets represents at least a threshold number of deltas.

3. The method of claim 2, wherein the method act of compressing is performed only for ones of the plurality of second datasets that do not represent at least the threshold number of deltas.

4. The method of claim 2, wherein the method act of compressing includes:
generating the compressed dataset from at least some of the plurality of second datasets that represent at least one delta but do not represent at least the threshold number of deltas;
adding a first flag to those portions of the compressed dataset that correspond to ones of the plurality of second datasets that represent at least one delta but do not represent at least the threshold number of deltas; and
adding a second flag, different from the first flag, to each of the plurality second datasets that represent at least the threshold number of deltas.

5. The method of claim 4, further including determining for each of the plurality of second datasets whether that one of the plurality of second datasets represents zero deltas, and if so then compressing that one of the plurality of second datasets by generating a third flag different from the first flag and the second flag.

6. The method of claim 1, wherein there are N datasets in the plurality of first datasets, each one of the plurality of first datasets is M bits in length, there are M datasets in the plurality of second datasets and the method act of generating the plurality of first datasets includes adding at least one constant bit to at least one of the first sets, thereby resulting in each of the first sets being M bits in length, wherein M and N>1.

7. The method of claim 1, further including forwarding the compressed second sets through a time-averaging buffer.

8. The method of claim 7, further including forwarding an output of the time-averaging buffer to a memory.

9. The method of claim 1, wherein there are N datasets in the plurality of first datasets, each one of the plurality of first datasets is M bits in length, there are M datasets in the plurality of second datasets and the method further includes forwarding the compressed dataset through a time-averaging buffer having a depth of at least 3×N×M bits, wherein M and N>1.

10. The method of claim 1, wherein there are N datasets in the plurality of first datasets, each one of the plurality of first datasets is M bits in length, there are M datasets in the plurality of second datasets and N>1.

11. The method of claim 1, wherein there are N datasets in the plurality of first datasets, each one of the plurality of first datasets is M bits in length, there are M datasets in the plurality of second datasets and M>1.

12. The method of claim 1, wherein at least some of the compression is performed while the design is being emulated.

13. The method of claim 1, wherein at least some of the compression is performed in real time from emulation trace data as it is produced by the emulation.

14. A computer-implemented method for compressing trace data of an emulator, the method comprising:
 receiving trace data from an emulator having reconfigurable hardware, the reconfigurable hardware including a plurality of integrated circuit chips, whereby the emulator can be configured to act as a circuit design that comprises different hardware than the emulator;
 generating, based at least in part on the trace data, a plurality of first datasets, each of the plurality of first datasets representing where deltas have occurred in the trace data, wherein deltas represent changes;
 generating, based at least in part on the trace data, a plurality of second datasets, each of the plurality of second datasets representing a different cross section that the plurality of first datasets;
 compressing at least one of the plurality of second datasets, wherein compressed trace data is generated;
 transferring the compressed trace data from the emulator to a first computer, wherein the emulator is divided, functionally, from the first computer; and
 wherein the circuit design can be debugged, at least in part, from the compressed trace data.

15. The method of claim 14, wherein the method act of compressing includes compressing the emulation trace data using delta compression.

16. The method of claim 14, wherein at least part of the emulation is performed on an integrated circuit chip and at least part of the compression is performed on the same integrated circuit chip.

17. The method of claim 16, wherein there are N datasets in the plurality of first datasets, each of the plurality of first datasets is M bits in length, there are M datasets in the plurality of second datasets and M>1.

18. The method of claim 14, wherein at least some of the compression is performed while the design is being emulated.

19. The method of claim 14, wherein at least some of the compression is performed in real time from emulation trace data as it is produced by the emulation.

20. An apparatus for compressing trace data, comprising:
 a system that receives trace data from an emulator having reconfigurable hardware, the reconfigurable hardware including a plurality of integrated circuit chips, whereby the emulator can be configured to act as a circuit design that comprises different hardware than the emulator;
 a system that generates, from the trace data, second data comprising one or more second sets, each second set representing where deltas have occurred in the trace data, wherein deltas represent changes;
 a compression system for compressing at least one of the second set, wherein the compression system includes at least one of the plurality of integrated circuit chips and the emulator emulates at least part of the circuit design on the same integrated circuit chip, wherein compressed data is generated; and
 wherein the design can be debugged, at least in part, from the compressed data.

* * * * *